United States Patent
Liao et al.

(10) Patent No.: US 10,354,924 B2
(45) Date of Patent: Jul. 16, 2019

(54) SEMICONDUCTOR MEMORY DEVICE AND METHOD OF MANUFACTURING THE SAME

(71) Applicant: MACRONIX International Co., Ltd., Hsinchu (TW)

(72) Inventors: Jeng-Hwa Liao, Hsinchu (TW); Zong-Jie Ko, Kaohsiung (TW); Jung-Yu Shieh, Hsinchu (TW); Ling-Wuu Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 35 days.

(21) Appl. No.: 15/691,510

(22) Filed: Aug. 30, 2017

(65) Prior Publication Data
US 2019/0067119 A1 Feb. 28, 2019

(51) Int. Cl.
*H01L 21/70* (2006.01)
*H01L 21/8234* (2006.01)
(Continued)

(52) U.S. Cl.
CPC ........... *H01L 21/823481* (2013.01); *H01L 21/02164* (2013.01); *H01L 21/02222* (2013.01);
(Continued)

(58) Field of Classification Search
CPC ......... H01L 21/76229; H01L 21/02164; H01L 21/76224; H01L 27/10894; H01L 27/11521; H01L 21/02222; H01L 21/31111; H01L 27/10876; H01L 21/02271; H01L 2924/0002; H01L 2924/00; H01L 21/28282; H01L 27/115; H01L 27/11568; H01L 21/76897; H01L 21/28273; H01L 22/12; H01L 29/7883; H01L 21/28052; H01L 29/42324; H01J 2237/2817; H01J 2237/221; H01J 37/28; H01J 2237/049; H01J 2237/063; H01J 2237/24592; H01J 2237/2594; H01J 2237/28; H01J 37/222; H01J 37/244; H01J 2237/2805; G06T 2207/30148; G06T 2207/10056; G06T 2207/10061; G06T 7/0004; G06T 7/0006; G06T 7/001; G06T 7/12; C09K 13/08; G01R 31/2831; G01R 31/305; G01R 31/2851; G01R 31/2653; G01R 31/04
See application file for complete search history.

(56) References Cited

U.S. PATENT DOCUMENTS 8,207,583 B2 6/2012 Juengling
8,288,279 B1 10/2012 Ho et al.
(Continued)

FOREIGN PATENT DOCUMENTS

CN 1571146 1/2005
CN 102543825 7/2012
TW 201633509 9/2016

OTHER PUBLICATIONS

"Office Action of Taiwan Counterpart Application," dated Nov. 8, 2017, p. 1-p. 9, in which the listed references were cited.

*Primary Examiner* — Robert G Bachner
(74) *Attorney, Agent, or Firm* — J.C. Patents (57) ABSTRACT

Provided is a semiconductor memory device including a substrate, a plurality of first isolation structures, and a plurality of second isolation structures. The substrate includes a periphery region and an array region. The first isolation structures are located in the substrate of the periphery region. The second isolation structures are located in the substrate of the array region. A material of the first isolation structures is different from a material of the second isolation structures. A width of each of the first isolation structures is greater than a width of each of the second isolation structures.

15 Claims, 6 Drawing Sheets

(51) Int. Cl.
    *H01L 21/762*     (2006.01)
    *H01L 21/311*     (2006.01)
    *H01L 21/02*     (2006.01)
    *H01L 27/11548*     (2017.01)
    *H01L 29/423*     (2006.01)

(52) U.S. Cl.
    CPC .. *H01L 21/02271* (2013.01); *H01L 21/02282* (2013.01); *H01L 21/02356* (2013.01); *H01L 21/31111* (2013.01); *H01L 21/31116* (2013.01); *H01L 21/76229* (2013.01); *H01L 27/11548* (2013.01); *H01L 29/42364* (2013.01)

(56) References Cited

U.S. PATENT DOCUMENTS

| | | | |
|---|---|---|---|
| 8,384,187 B2 * | 2/2013 | Sawada | H01L 21/76229 257/506 |
| 8,828,877 B2 | 9/2014 | Sakurai | |
| 9,385,240 B1 | 7/2016 | Cheng et al. | |
| 9,895,973 B2 * | 2/2018 | Kuenzner | B60K 35/00 |
| 2002/0190342 A1 | 12/2002 | Hur | |
| 2005/0064662 A1 | 3/2005 | Yang et al. | |
| 2007/0114631 A1 * | 5/2007 | Sato | H01L 21/76224 257/506 |
| 2007/0232019 A1 | 10/2007 | Cho | |
| 2008/0179715 A1 | 7/2008 | Coppa | |
| 2009/0170321 A1 | 7/2009 | Cho et al. | |
| 2009/0194810 A1 * | 8/2009 | Kiyotoshi | H01L 21/76229 257/326 |
| 2011/0233640 A1 * | 9/2011 | Hatakeyama | H01L 21/76229 257/316 |
| 2012/0028437 A1 | 2/2012 | Watanabe et al. | |
| 2013/0052795 A1 * | 2/2013 | Watanabe | H01L 21/76229 438/427 |
| 2014/0159193 A1 | 6/2014 | Kim et al. | |
| 2014/0264726 A1 | 9/2014 | Chan et al. | |
| 2015/0048430 A1 * | 2/2015 | He | H01L 21/31111 257/288 |
| 2016/0111518 A1 * | 4/2016 | Chang | H01L 29/6681 257/401 |

* cited by examiner

SEMICONDUCTOR MEMORY DEVICE AND METHOD OF MANUFACTURING THE SAME

BACKGROUND

Field of the Invention

The invention is directed to a semiconductor device and a method of manufacturing the same. More particularly, the invention is to a semiconductor memory device and a method of manufacturing the same.

Description of Related Art

Along with the progress in semiconductor technologies, integration of devices in a memory cell array region and a peripheral circuit region on the same chip has gradually become an advance in technology trends in order to meet demands of reducing cost, simplifying process steps and saving a chip area. As device sizes are continuously reduced, isolation between the devices becomes more and more important in order to prevent a short-circuit issue occurring between the adjacent devices.

Generally speaking, a flowable dielectric material is usually employed as a material of isolation structures. However, when a thermal treatment is performed to remove a solvent from the flowable dielectric material, a serious dislocation issue, even a crack or split issue may occur to a substrate or the isolation structures in the peripheral circuit region due to a stress or a shrinkage of the flowable dielectric material. If the cracks or splits appear to the substrate or the isolation structures, it will cause deterioration to an isolation capability of the isolation structures, and as a result, issues, such as a leakage current of the devices or poorer device reliability, may arise.

SUMMARY

The invention provides a semiconductor memory device and a method of manufacturing the same, which can prevent the dislocation or crack issue from occurring to a substrate or isolations structures in a peripheral circuit region, so as to reduce a leakage current of the devices and increase a reliability of the devices.

A semiconductor memory device including a substrate, a plurality of first isolation structures and a plurality of second isolation structures is provided. The substrate includes a periphery region and an array region. The first isolation structures are located over the substrate in the periphery region. The second isolation structures are located over the substrate in the array region. A material of the first isolation structure is different from a material of the second isolation structures. A width of each of the first isolation structures is greater than a width of each of the second isolation structures.

A method of manufacturing a semiconductor memory device is provided. The method includes the following steps. A substrate including a periphery region and an array region is provided. A plurality of first stack structures are formed over the substrate in the periphery region. A plurality of first trenches are formed respectively between the first stack structures. The first trenches extend from top surfaces of the first stack structure into the substrate. A plurality of second stack structures are formed over the substrate in the array region. A plurality of second trenches are formed respectively between the second stack structures. The second trenches extend from top surfaces of the second stack structures into the substrate. A width of each of the second trenches is less than a width of each of the first trenches. A first isolation material is filled simultaneously in the first trenches and the second trenches. A mask pattern is formed over the substrate in the array region. The mask pattern exposes a top surface of the first isolation material in the first trenches. By using the mask pattern as a mask, at least a part of the first isolation material in the first trenches is removed. Forming a second isolation material in the first trenches. A thermal treatment is performed.

Based on the above, in the invention, the flowable dielectric material is simultaneously filled in the first trenches in the periphery region and the second trenches in the array region, such that the flowable dielectric material can be fully filled up the second trenches with a high aspect ratio. Then, at least a part of the flowable dielectric material in the first trenches is removed. Thereafter, the chemical vapor deposition oxide is formed in the first trenches. When the thermal treatment is subsequently performed to remove a solvent from the flowable dielectric material, an area between the flowable dielectric material in the first trenches and the substrate is reduced, and thus, the substrate in the periphery region or the isolation structures can be prevented from the dislocation and crack issue. In this way, the isolation structures in both the periphery region and the array region in the invention can have a preferable isolation capability, so as to reduce the leakage current of the devices and increase a breakdown voltage and the reliability of the devices.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The invention will be described more comprehensively with reference to the drawings of the embodiments. However, the invention may also be implemented in various manners and should not be limited to the embodiments described herein. For the sake for clarity, thicknesses of layers and regions in the drawings will be exaggerated. The same or similar reference numbers are used to refer to the same or like parts and will not be repeatedly described in the following paragraphs.

Figure 1:
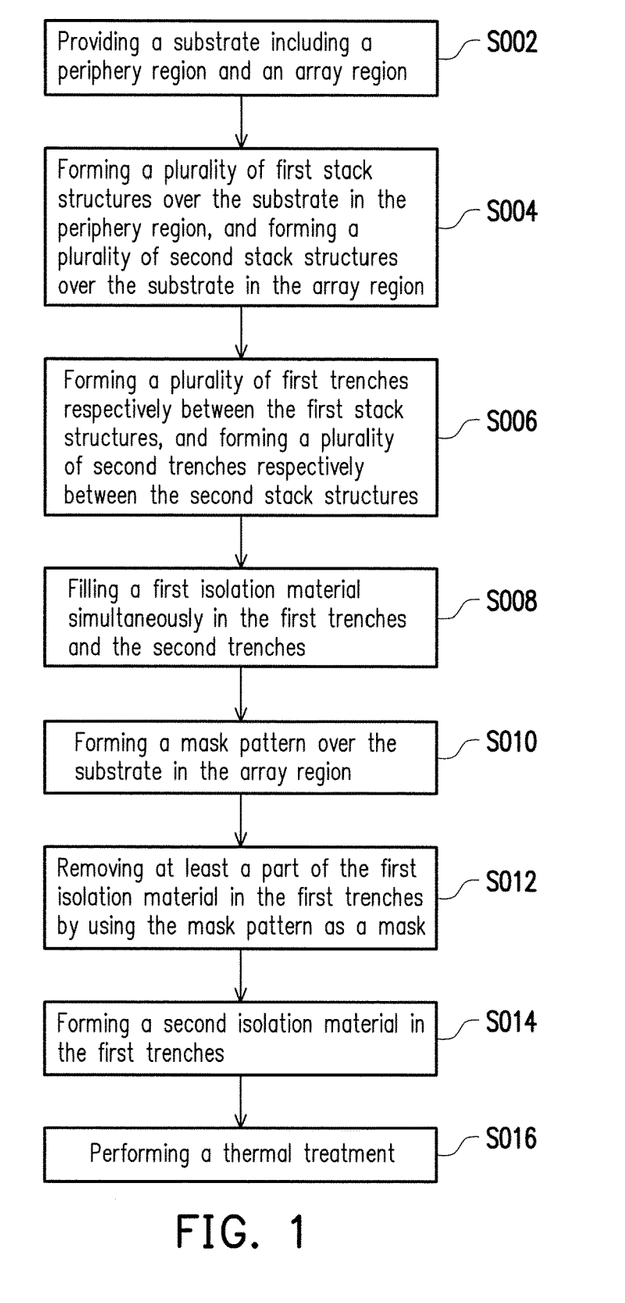
FIG. 1 is a flowchart of a method of manufacturing a semiconductor memory device according to a first embodiment of the invention.

FIG. 1 is a flowchart of a method of manufacturing a semiconductor memory device according to a first embodiment of the invention. FIG. 2A to FIG. 2H are schematic cross-sectional diagrams of the method of manufacturing the semiconductor memory device according to a first embodiment of the invention.

Figure 2A:
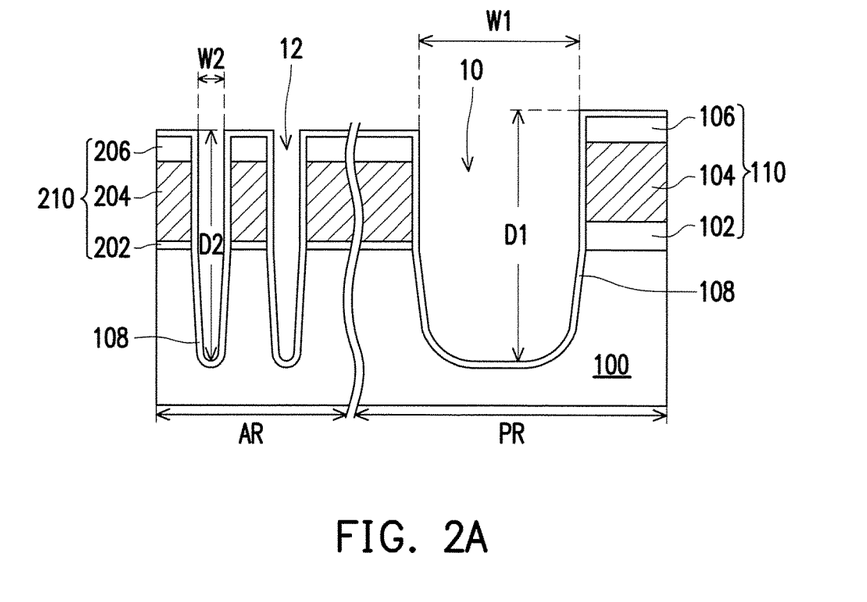
FIG. 2A to FIG. 2H are schematic cross-sectional diagrams of the method of manufacturing the semiconductor memory device according to a first embodiment of the invention.

Referring to FIG. 1 and FIG. 2A, first, step S002 is performed, where a substrate 100 is provided. In an embodiment, the substrate 100 may be, for example, a semiconductor substrate, a semiconductor compound substrate or a semiconductor over insulator (SOI) substrate. The semiconductor includes, for example, a group IVA atom, such as silicon or germanium. The semiconductor compound is, for example, a semiconductor compound formed by a group IVA atom, such as silicon carbide or silicon germanium, or a semiconductor compound formed by a group IIIA atom and a group VA atom, such as gallium arsenide.

In the present embodiment, the substrate 100 includes a periphery region PR and an array region AR. The periphery region PR may be, for example, a peripheral circuit region which contains metal oxide semiconductor devices. The array region AR may be, for example, a memory cell array region which contains memory devices. In other embodiments, the array region AR may be a device-concentrated region, and the number of the devices per unit area in the array region AR is greater than the number of the devices per unit area in the periphery region PR.

Then, step S004 is performed, where a plurality of first stack structures 110 are formed on the substrate 100 in the periphery region PR, and a plurality of second stack structures 210 are formed on the substrate 100 in the array region AR. Specifically, each of the first stack structures 110 includes a first gate dielectric layer 102, a first gate 104 and a hard mask layer 106 formed in order on a top surface of the substrate 100. In an embodiment, a material of the first gate dielectric layer 102 may be, for example, silicon oxide, silicon nitride or a combination thereof, and a forming method thereof may be a chemical vapor deposition (CVD) method. A material of the first gate 104 may be, for example, doped polysilicon, non-doped polysilicon or a combination thereof, and a forming method thereof may be a CVD method. A material of the hard mask layer 106 may be, for example, silicon oxide, silicon nitride or a combination thereof, and a forming method thereof may be a CVD method. In the present embodiment, the first gate dielectric layer 102 and the first gate 104 may constitute a gate structure of the metal oxide semiconductor device, a source and a drain (not shown) are formed in the substrate 100 at two sides of the gate structure.

In addition, each of the second stack structures 210 includes a second gate dielectric layer 202, a second gate 204 and a hard mask layer 206 formed in order on the top surface of the substrate 100. Materials and forming methods of the second gate dielectric layer 202, the second gate 204 and the hard mask layer 206 are similar to the materials and the forming methods of the first gate dielectric layer 102, the first gate 104 and the hard mask layer 106 and thus, will not be repeatedly described. In the present embodiment, the second gate dielectric layer 202 may be employed as a tunneling dielectric layer of the memory device, and the second gate 204 may be employed as a floating gate of the memory device. In an embodiment, a thickness of the second gate dielectric layer 202 is less than a thickness of the first gate dielectric layer 102. The thickness of the second gate dielectric layer 202 may range between 5 nanometers (nm) and 10 nm, and the thickness of the first gate dielectric layer 102 may range between 5 nm and 70 nm.

Then, step S006 is performed, where a plurality of first trenches 10 are formed respectively between the first stack structures 110, and a plurality of second trenches 12 are formed respectively between the second stack structures 210. Specifically, a method of forming the first trenches 10 and the second trenches 12 may include forming a mask pattern (not shown) on top surfaces of the first stack structure 110 and the second stack structure 210, thereby exposing positions or regions where the first trenches 10 and the second trenches 12 are to be formed. Parts of the hard mask layers 106 and 206, a part of the first gate 104, a part of the second gate 204, a part of the first gate dielectric layer 102, a part of the second gate dielectric layer 202 and a part of the substrate 100 are removed, such that the first trenches 10 extend from the top surface of the first stack structure 110 into the substrate 100, and the second trenches 12 extend from the top surface of the second stack structure 210 into the substrate 100 (as illustrated in FIG. 2A). In other words, the first trenches 10 and the second trenches 12 may be simultaneously formed, and bottom surfaces of the first trenches 10 and the second trenches 12 may be substantially coplanar.

After the first trenches 10 and the second trenches 12 are formed, a dielectric material 108 is formed over the substrate 100. As illustrated in FIG. 2A, the dielectric material 108 conformally covers a surface of the first trench 10, surfaces of the second trenches 12 and top surfaces of the hard mask layers 106 and 206. In an embodiment, the dielectric material 108 may be silicon oxide, and a forming method thereof may be, for example, a CVD method, an atomic layer deposition (ALD) method or a combination thereof.

It should be noted that a width W2 of each of the second trenches 12 located in the array region AR is less than a width W1 of each of the first trenches 10 located in the periphery region PR. Additionally, an aspect ratio of each of the second trench 12 located in the array region AR is greater than an aspect ratio of each of the first trench 10 located in the periphery region PR. In an embodiment, the width W1 of the first trench 10 may range between 0.2 μm and 8 μm, and the width W2 of the second trench 12 may range between 0.01 μm and 0.03 μm. In an embodiment, the aspect ratio (i.e., a depth D1/the width W1) of the first trench 10 may range between 0.04 and 2, and the aspect ratio (i.e., a depth D2/the width W2) of the second trench 12 may range between 10 and 35.

Figure 2B:
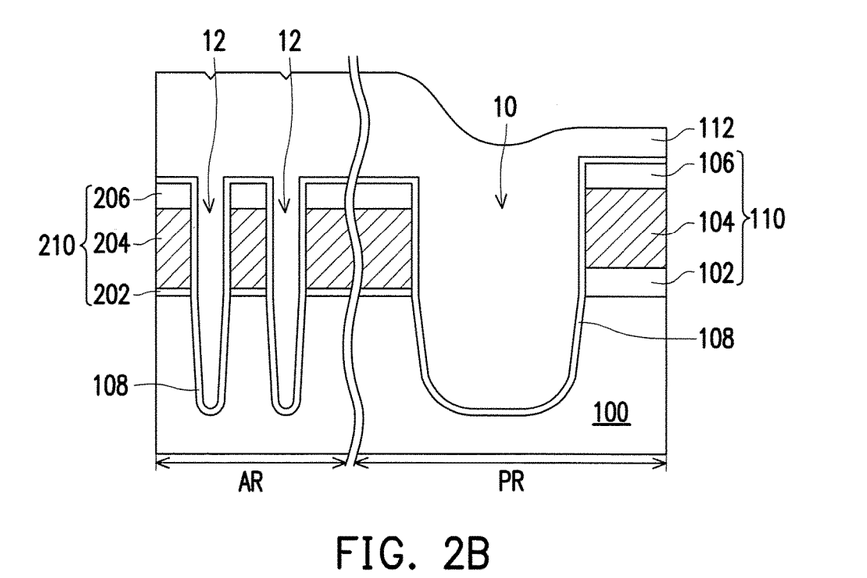

Referring to FIG. 1 and FIG. 2B, step S008 is performed, where a first isolation material 112 is filled simultaneously in the first trenches 10 and the second trenches 12. The first isolation material 112 is not only filled in the first trenches 10 and the second trenches 12, but also covers the top surfaces of the first stack structure 110 and the second stack structure 210. In the present embodiment, the first isolation material 112 may be a flowable dielectric material, such as a spin-on dielectric material. The flowable dielectric material has a preferable gap-filling capability and may be filled in the second trenches 12 having a greater aspect ratio without forming voids, such that a subsequently formed second isolation structure 222 (as illustrated in FIG. 2H) has a preferable isolation capability.

In an embodiment, a method of forming the first isolation material 112 includes spin-on dielectric (SOD) method, a flowable chemical vapor deposition (FCVD) method or a combination thereof. Taking the SOD method as an example, a flowable dielectric material, e.g., polysilazane (PSZ) may be spin-coated on the substrate 100, thereby filling the flowable dielectric material in the first trenches 10 and the second trenches 12 without forming voids.

Figure 2C:
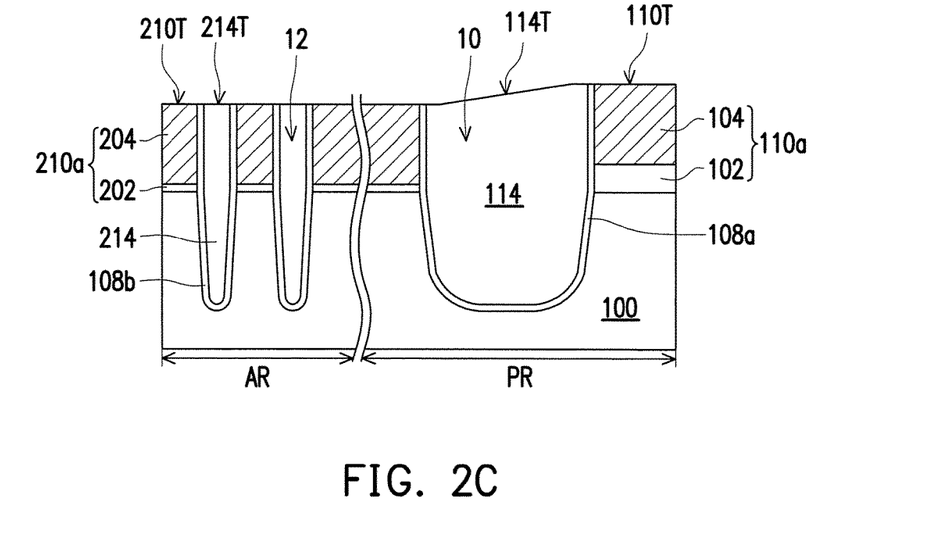

Referring to FIG. 2B and FIG. 2C, a planarization process is performed to remove the first isolation material 112, the dielectric material 108 and the hard mask layers 106 and 206 on the top surfaces of the first stack structure 110 and the second stack structure 210. In an embodiment, the planarization process may be a chemical mechanical polishing (CMP) process or an etching-back process. After the planarization process, the first isolation material remaining in the first trenches 10 may be regarded as a first isolation material 114, and a dielectric layer 108a is located between the first isolation material 114 and the substrate 100 (or a first stack structure 110a). The first isolation material remaining in the second trenches 12 may be regarded as a first isolation material 214, and a dielectric layer 108b is located between the first isolation material 214 and the substrate 100 (or a second stack structure 210a). In this circumstance, as illustrated in FIG. 2C, a top surface 214T of the first isolation material 214 in the second trenches 12 is substantially coplanar with a top surface 210T of the second stack structure 210a. On the other hand, as a top surface 110T of the first stack structure 110a is higher than a top surface 210T of the second stack structure 210a, a top surface 114T of the first isolation material 114 between the first stack structure 110a and the second stack structure 210a is an inclined surface. A height of the inclined surface is gradually decreased along a direction from a side adjacent to the first stack structure 110a to another side adjacent to the second stack structure 210a.

Figure 2D:
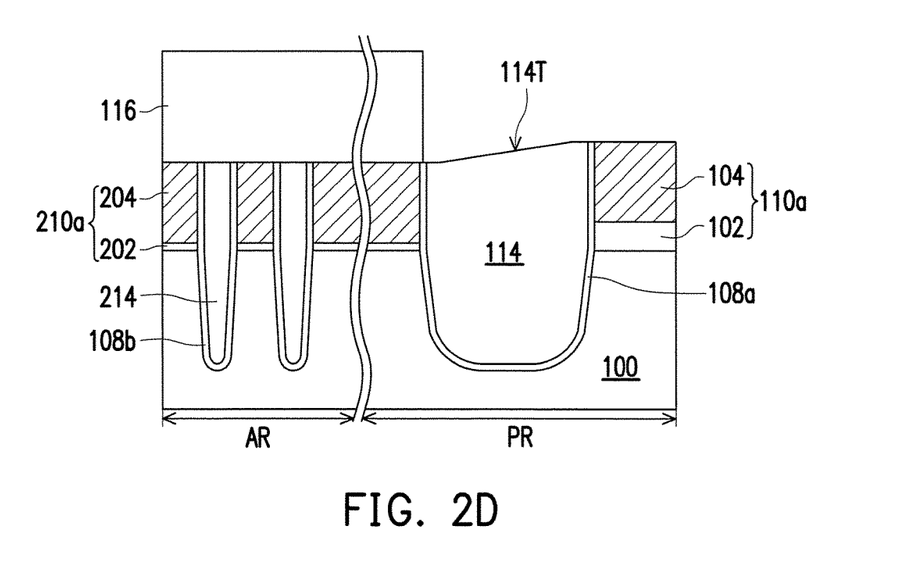

Referring to FIG. 1 and FIG. 2D, step S010 is performed, where a mask pattern 116 is formed over the substrate 100 in the array region AR. The mask pattern 116 covers the first isolation material 214 in the second trenches 12 in the array region AR and exposes the top surface 114T of the first isolation material 114 in the first trenches 10 in the periphery region PR. In an embodiment, the mask pattern 116 may include a photoresist material, and a forming method thereof may be, for example, a photolithography process.

Figure 2E:
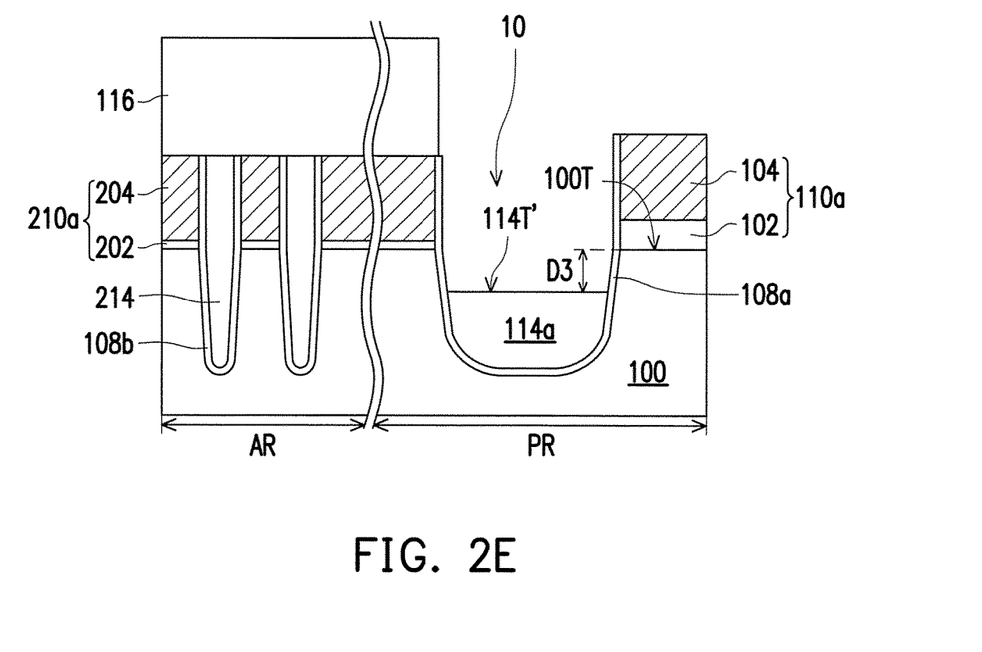

Referring to FIG. 1 and FIGS. 2D-2E, step S012 is performed, where a part of the first isolation material 114 in the first trenches 10 is removed by using the mask pattern 116 as a mask. In an embodiment, a method of removing the part of the first isolation material 114 in the first trenches 10 includes a dry etching method, a wet etching method or a combination thereof. Specifically, the dry etching method includes using a reaction gas containing a fluorocarbon compound mixed with nitrogen and oxygen. The aforementioned fluorocarbon compound may be expressed as CxFy (in which x is 4-6, and y is 6-8) or CxHyFz (in which x is 1-2, y is 1-3, and z is 1-3). The wet etching method includes using an etchant containing buffer hydrogen fluoride (BHF), diluted hydrogen fluoride (DHF) or a combination thereof. The aforementioned reaction gas and etchant have high etching selectivity with respect to the first isolation material 114 and the first gate 104.

It should be noted that after the part of the first isolation material 114 in the first trenches 10 is removed, a distance D3 between a top surface 114T' of a remaining first isolation material 114a and a highest top surface 100T (i.e., an interface between the substrate 100 and the first gate dielectric layer 102) of the substrate 100 is at least greater than 500 Å. This step may contribute to reducing an area between the first isolation material 114a (i.e., the flowable dielectric material) in the first trenches 10 and the substrate 100. In this way, the present embodiment may contribute to preventing a dislocation or crack issue from occurring to the substrate 100 in the periphery region PR or the first isolation structures 122 (as illustrated in FIG. 2H) due to a stress or a shrinkage of the flowable dielectric material when a thermal treatment is subsequently performed. In an embodiment, the distance D3 between the top surface 114T' of the remaining first isolation material 114a and the highest top surface 100T of the substrate 100 may range between 500 Å and 3000 Å. In a substitution embodiment, the first isolation material 114 in the first trenches 10 may also be completely removed.

Figure 2F:
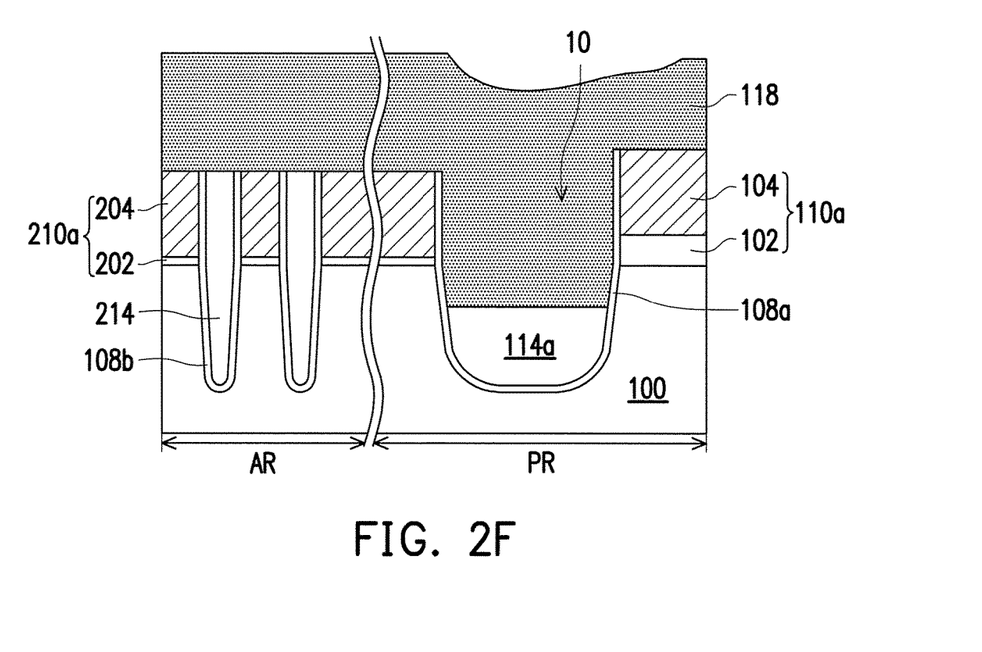

Referring to FIG. 1 and FIG. 2F, step S014 is performed, where a second isolation material 118 is formed in the first trenches 10. The second isolation material 118 is not only fully filled in spaces on the first isolation material 114a, but also covers the top surfaces of the first stack structure 110a and the second stack structure 210a. In an embodiment, the second isolation material 118 may be chemical vapor deposition oxide, and a forming method thereof may be, for example, a high density plasma chemical vapor deposition (HDPCVD) method, a high aspect ratio process (e-HARP) or a combination thereof. As densification and silicon-oxygen bonding strength of the second isolation material 118 are greater than densification and silicon-oxygen bonding strength of the first isolation material 114a or 214 (i.e., the flowable dielectric material), the second isolation material 118 may be fully filled in most of the spaces in the first trenches 10, without causing any dislocation or crack issue after the thermal treatment is performed.

Figure 2G:
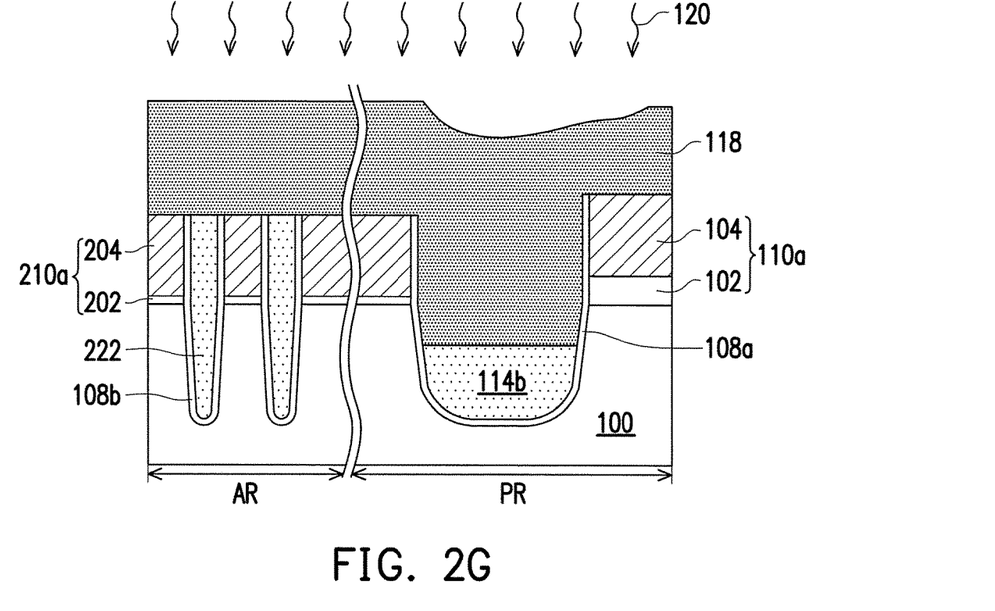
Figure 2H:
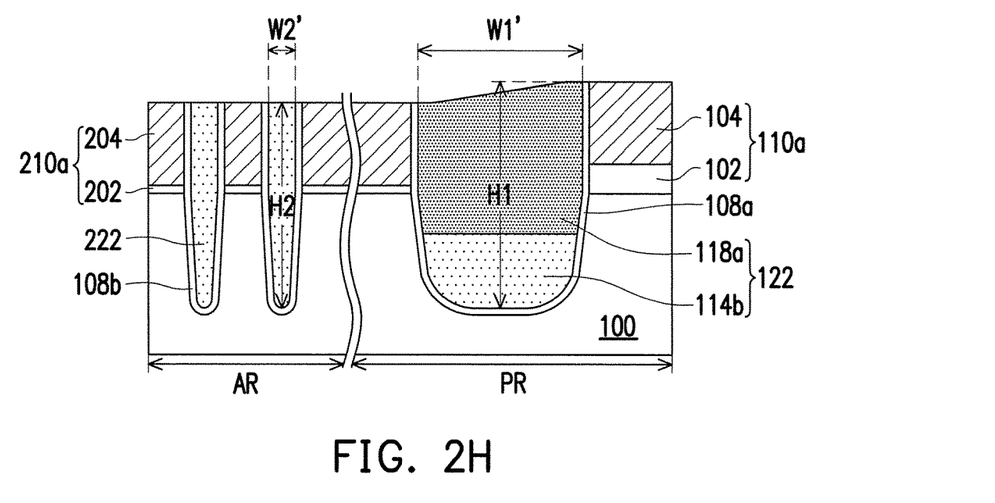

Referring to FIG. 1 and FIGS. 2F-2G, step S016 is performed, where a thermal treatment 120 to remove a solvent from the first isolation materials 114a or 214 (i.e., the flowable dielectric material), thereby curing the flowable dielectric material. In an embodiment, the thermal treatment 120 may be a furnace thermal treatment or a rapid thermal treatment. Taking the furnace thermal treatment as an example, it may be performed under $H_2O$ ambient gas and at a temperature ranging from 300° C. to 500° C. for 30 minutes to 60 minutes. Then, it may be performed under $N_2$ ambient gas and at a temperature ranging from 700° C. to 900° C. for 30 minutes to 60 minutes.

It should be noted that in comparison with a total space of the first trenches 10, an area between a cured first isolation material 114b and the substrate 100 is smaller. After the thermal treatment 120, a stress of the cured first isolation material 114b is also reduced accordingly, and thereby, the dislocation or crack issue may be prevented from occurring to the substrate 100 in the periphery region PR or the cured first isolation material 114b, so as to reduce a leakage current of the devices and increase a breakdown voltage and reliability of the devices. In addition, as the flowable dielectric material with the preferable gap-filling capability is filled in the second trenches 12 with a greater aspect ratio, it does not cause the foil ration of the voids, such that a cured first isolation material 222 (i.e., the second isolation structure 222) has a preferable isolation capability.

Referring to FIG. 2G and FIG. 2H, after the thermal treatment 120 is performed, a planarization process is further performed to remove the second isolation material 118 on the top surfaces of the first stack structure 110a and the second stack structure 210a. In an embodiment, the planarization process may be a CMP process or an etching-back process. After the planarization process, the second isolation material 118a remaining in the first trenches 10 may be regarded as an upper structure 118a of the first isolation structure 122, and the cured first isolation material 114b may be regarded as a lower structure 114b of the first isolation structure 122. The lower structure 114b and the upper structure 118a located on the lower structure 114b may constitute the first isolation structure 122. In an embodiment, a material of the lower structure 114b of the first isolation structure 122 and a material of the second isolation structure 222 are the same and simultaneously formed, and a material of the upper structure 118a of the first isolation structure 122 is difference from the material of the second isolation structure 222.

Moreover, after the planarization process, the manufacturing method further includes sequentially forming an inter-layer dielectric layer and a control gate (not shown) on the second stack structure 210a in the array region AR, so as to form a plurality of memory devices. In an embodiment, the memory devices include flash memories, such as NAND flash memories.

As illustrated in FIG. 2H, a semiconductor memory device of the present embodiment includes: a substrate 100, a plurality of first stack structures 110a, a plurality of second stack structures 210a, a plurality of first isolation structures 122 and a plurality of second isolation structures 222. The substrate 100 includes a periphery region PR and an array region AR. The first stack structures 110a are located over the substrate 100 in the periphery region PR. The second stack structures 210a are located over the substrate 100 in the array region AR. The first isolation structures 122 are located between the first stack structures 110a and extend from top surfaces of the first stack structures 110a into the substrate 100. The second isolation structures 222 are located between the second stack structures 210a and extend from tops surfaces of the second stack structures 210a into the substrate 100.

It should be noted that a width W1' of each of the first isolation structures 122 is greater than a width W2' of each of the second isolation structures 222. In addition, an aspect ratio of each of the second isolation structures 222 located in the array region AR is greater than an aspect ratio of each of the first isolation structures 122 located in the periphery region PR. In an embodiment, the width W1' of each of the first isolation structures 122 may range between 0.2 μm and 8 μm, and the width W2' of each of the second isolation structures 222 may range between 0.01 μm and 0.03 μm. In an embodiment, the aspect ratio (a height H1/the width W1') of each of the first isolation structures 122 may range between 0.04 and 2, and the aspect ratio (a height H2/the width W2') of each of the second isolation structures 222 may range between 10 and 35.

Figure 3:
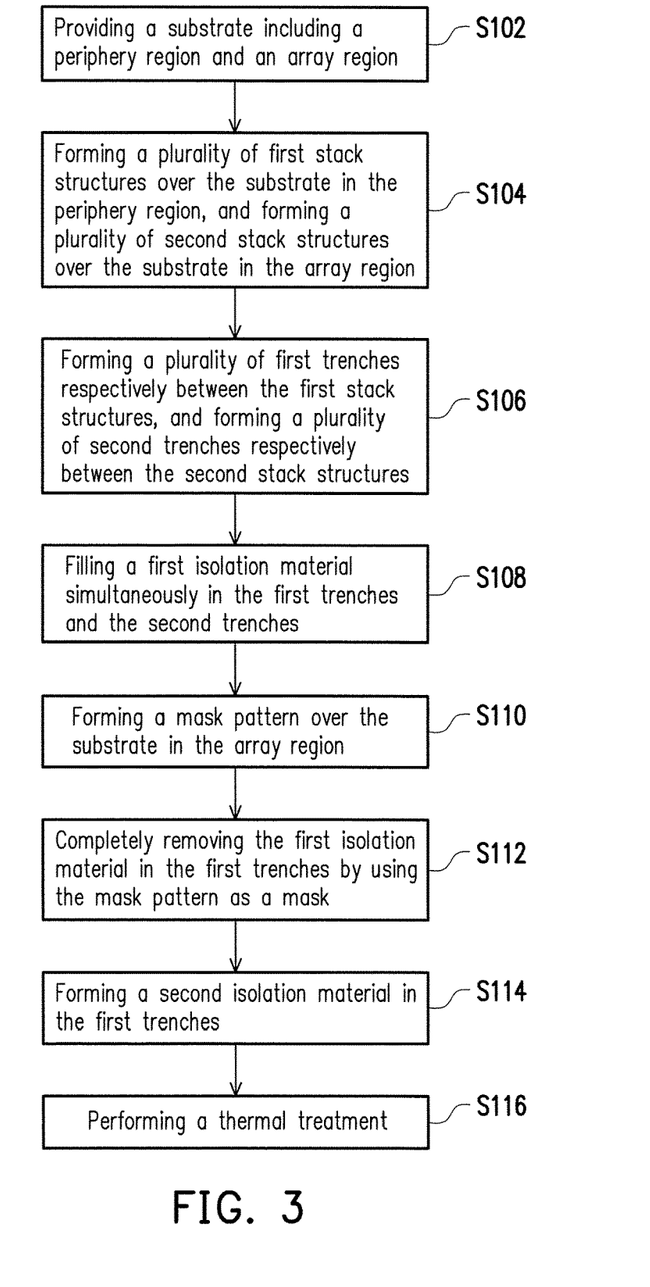
FIG. 3 is a flowchart of a method of manufacturing a semiconductor memory device according to a second embodiment of the invention.

FIG. 3 is a flowchart of a method of manufacturing a semiconductor memory device according to a second embodiment of the invention.

Referring to FIG. 3, basically, a method of manufacturing a semiconductor memory device of the second embodiment of the invention is similar to the method of manufacturing the semiconductor memory device of the first embodiment of the invention. Namely, steps S102, S104, S106, S108 and S110 are similar to steps S002, S004, S006, S008 and S010. The difference between the two embodiments lies in that in step S112 of the present embodiment, a first isolation material in first trenches is completely removed by using a mask pattern as a mask, such that no first isolation material remains in the first trenches. Thereafter, step S114 is performed, where a second isolation material is formed in the first trenches. Namely, the second isolation material is fully filled up the first trenches. Then, step S116 is performed, where a thermal treatment is performed to remove a solvent from the first isolation material (i.e., the flowable dielectric material) in the second trenches, thereby curing the flowable dielectric material.

In light of the foregoing, in the invention, the flowable dielectric material is simultaneously filled in the first trenches in the periphery region and the second trenches in the array region, such that the flowable dielectric material can be fully filled up the second trenches with the high aspect ratio. Then, at least a part of the flowable dielectric material in the first trenches is removed. Thereafter, the chemical vapor deposition oxide is formed in the first trenches. When the thermal treatment is subsequently performed to remove the solvent from the flowable dielectric material, the area between the flowable dielectric material in the first trenches and the substrate is reduced, and thus, the substrate in the periphery region or the isolation structures can be prevented from the dislocation and crack issue. In this way, the isolation structures in both the periphery region and the array region in the invention can have the preferable isolation capability, so as to reduce the leakage current of the devices and increase the breakdown voltage and the reliability of the devices.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A semiconductor memory device, comprising:
a substrate, comprising a periphery region and an array region;
a plurality of first isolation structures, located over the substrate in the periphery region, wherein each of the first isolation structures comprises a lower structure and an upper structure located over the lower structure, a material of the lower structures comprises a flowable dielectric material, a material of the upper structures comprises a chemical vapor deposition (CVD) oxide, a highest top surface of each of the lower structures is lower than a highest top surface of the substrate, and a distance between the highest top surface of each of the lower structures and the highest top surface of the substrate is at least greater than 500 Å; and
a plurality of second isolation structures, located over the substrate in the array region, wherein a width of each of the first isolation structures is greater than a width of each of the second isolation structures.

2. The semiconductor memory device according to claim 1, wherein the width of each of the first isolation structures ranges between 2 μm and 8 μm, and the width of each of the second isolation structures ranges between 0.01 μm and 0.03 μm.

3. The semiconductor memory device according to claim 1, wherein an aspect ratio of each of the first isolation structures ranges between 0.04 and 2, and an aspect ratio of each of the second isolation structures ranges between 10 and 35.

4. The semiconductor memory device according to claim 1, wherein the flowable dielectric material comprises a spin-on dielectric (SOD) material.

5. The semiconductor memory device according to claim 1, wherein densification and silicon-oxygen bonding strength of the upper structures are greater than densification and silicon-oxygen bonding strength of the lower structures or the second isolation structures.

6. The semiconductor memory device according to claim 1, further comprising:
a plurality of first stack structures, located over the substrate in the periphery region, wherein the first isolation structure are respectively disposed between the first stack structures, and each of the first stack structures comprises a first gate dielectric layer and a first gate formed in order on a top surface of the substrate;

a first dielectric layer, located between the first isolation structures and the first stack structures;

a plurality of second stack structures, located over the substrate in the array region, wherein the second isolation structures are respectively disposed between the second stack structures, and each of the second stack structures comprises a second gate dielectric layer and a second gate formed in order on the top surface of the substrate, wherein a thickness of the second gate dielectric layer is less than a thickness of the first gate dielectric layer; and a second dielectric layer, located between the second isolation structures and the second stack structures.

7. A method of manufacturing a semiconductor memory device, comprising:

providing a substrate comprising a periphery region and an array region;

forming a plurality of first stack structures over the substrate in the periphery region;

forming a plurality of first trenches respectively between the first stack structures, wherein the first trenches extend from top surfaces of the first stack structures into the substrate;

forming a plurality of second stack structures over the substrate in the array region;

forming a plurality of second trenches respectively between the second stack structures, wherein the second trenches extend from top surfaces of the second stack structures into the substrate, wherein a width of each of the second trenches is less than a width of each of the first trenches;

filling a first isolation material simultaneously in the first trenches and the second trenches;

forming a mask pattern over the substrate in the array region, wherein the mask pattern exposes a top surface of the first isolation material in the first trenches;

removing at least a part of the first isolation material in the first trenches by using the mask pattern as a mask;

forming a second isolation material in the first trenches;

performing a thermal treatment; and performing a planarization process on the second isolation material, so as to form first isolation structures in the first trenches and form second isolation structures in the second trenches, wherein each of the first isolation structures comprises a lower structure and an upper structure located over the lower structure, a material of the lower structures comprises a flowable dielectric material, a material of the upper structures comprises a chemical vapor deposition (CVD) oxide, a highest top surface of each of the lower structures is lower than a highest top surface of the substrate, and a distance between the highest top surface of each of the lower structures and the highest top surface of the substrate is at least greater than 500 Å.

8. The method according to claim 7, wherein a method of removing the at least a part of first isolation material in the first trenches comprises a dry etching method, a wet etching method or a combination thereof.

9. The method according to claim 8, wherein the dry etching method comprises using a reaction gas containing a fluorocarbon compound mixed with nitrogen and oxygen.

10. The method according to claim 8, wherein the wet etching method comprises using an etchant containing buffer hydrogen fluoride (BHF), diluted hydrogen fluoride (DHF) or a combination thereof.

11. The method according to claim 7, wherein a forming method of the first isolation material comprises a spin-on dielectric (SOD) method, a flowable chemical vapor deposition (FCVD) method or a combination thereof.

12. The method according to claim 7, wherein a forming method of the second isolation material comprises a high density plasma chemical vapor deposition (HDP CVD) method, a high aspect ratio process (e-HARP) or a combination thereof.

13. The method according to claim 7, wherein densification and silicon-oxygen bonding strength of the second isolation material are greater than densification and silicon-oxygen bonding strength of the lower structures of the first isolation material.

14. The method according to claim 7, wherein the thermal treatment comprises a furnace thermal treatment or a rapid thermal treatment.

15. The method according to claim 7, wherein the planarization process comprises a chemical mechanical polishing (CMP) process, an etching-back process or a combination thereof.

* * * * *